(12) United States Patent
Starkovich et al.

(10) Patent No.: US 10,899,102 B1
(45) Date of Patent: Jan. 26, 2021

(54) CARBON NANOTUBE SHEET OPTICAL BELLOWS WITH ENHANCED STRAY LIGHT SUPPRESSION AND METHOD OF MANUFACTURE

(71) Applicant: Northrop Grumman Systems Corporation, Falls Church, VA (US)

(72) Inventors: John A Starkovich, Redondo Beach, CA (US); Andrew D Kostelec, Fullerton, CA (US); Edward M. Silverman, Encino, CA (US)

(73) Assignee: NORTHROP GRUMMAN SYSTEMS CORPORATION, Falls Church, VA (US)

( * ) Notice: Subject to any disclaimer, the term of this patent is extended or adjusted under 35 U.S.C. 154(b) by 0 days.

(21) Appl. No.: 16/670,085

(22) Filed: Oct. 31, 2019

(51) Int. Cl.
*G02B 27/00* (2006.01)
*B32B 1/08* (2006.01)
(Continued)

(52) U.S. Cl.
CPC ........... *B32B 1/08* (2013.01); *B32B 3/266* (2013.01); *B32B 5/022* (2013.01); *B32B 7/12* (2013.01);
(Continued)

(58) Field of Classification Search
CPC .... B32B 1/08; B32B 3/00; B32B 3/26; B32B 3/266; B32B 5/02; B32B 5/022; B32B 27/06; B32B 27/08; B32B 27/12; B32B 27/28; B32B 27/281; B32B 27/36; B32B 37/12; B32B 37/14; B32B 37/16; B32B 37/182; B32B 38/00; B32B 38/0004;
(Continued)

(56) References Cited

U.S. PATENT DOCUMENTS 10,584,418 B1 * 3/2020 Starkovich .............. C23C 16/50
2008/0063860 A1 3/2008 Song
(Continued)

FOREIGN PATENT DOCUMENTS

WO 2019/194914 A1 10/2019

OTHER PUBLICATIONS

Tomlin et al (Decrease in Reflectance of vertically aligned carbon nanotubes after oxygen plasma treatment, Carbon 74, pp. 329-332, Mar. 30, 2014) (Year: 2014).*
(Continued)

*Primary Examiner* — Stephone B Allen
*Assistant Examiner* — Jyotsna V Dabbi
(74) *Attorney, Agent, or Firm* — McCracken & Gillen LLC

(57) ABSTRACT

A polygonally shaped carbon nanotube (CNT) sheet optical bellows providing enhanced stray light suppression, the polygonally shaped CNT sheet optical bellows includes: a free-standing non-woven CNT sheet; a polymer bonded to the non-woven CNT sheet; and an elastomer film bonded to the polymer film, creating a laminate film, the laminate film being rolled to form a cylinder by applying an adhesive along a bonding edge of the laminate film to adhere the bonding edge to an opposite edge of the laminate film, an outer side of the laminate film comprising diamond-shaped elements, the diamond-shaped elements being pinched, pressed, folded and collapsed in a rotating manner around a circumference of the cylinder, creating the polygonally shaped CNT sheet optical bellows.

18 Claims, 9 Drawing Sheets

(51) Int. Cl.
| | |
|---|---|
| B32B 7/12 | (2006.01) |
| B32B 5/02 | (2006.01) |
| B32B 27/08 | (2006.01) |
| B32B 27/12 | (2006.01) |
| B32B 37/12 | (2006.01) |
| B32B 37/18 | (2006.01) |
| B32B 38/00 | (2006.01) |
| B32B 27/28 | (2006.01) |
| B32B 27/36 | (2006.01) |
| G02B 5/00 | (2006.01) |
| B32B 3/26 | (2006.01) |
| H01L 51/00 | (2006.01) |
| C01B 32/158 | (2017.01) |
| B82Y 20/00 | (2011.01) |

(52) U.S. Cl.
CPC .............. *B32B 27/08* (2013.01); *B32B 27/12* (2013.01); *B32B 27/281* (2013.01); *B32B 27/36* (2013.01); *B32B 37/12* (2013.01); *B32B 37/182* (2013.01); *B32B 38/0004* (2013.01); *B32B 38/0008* (2013.01); *C01B 32/158* (2017.08); *G02B 5/003* (2013.01); *H01L 51/0048* (2013.01); *B32B 2250/03* (2013.01); *B32B 2255/10* (2013.01); *B32B 2255/205* (2013.01); *B32B 2255/26* (2013.01); *B32B 2255/28* (2013.01); *B32B 2262/106* (2013.01); *B32B 2305/28* (2013.01); *B32B 2310/0862* (2013.01); *B32B 2310/0868* (2013.01); *B32B 2310/14* (2013.01); *B32B 2313/04* (2013.01); *B32B 2367/00* (2013.01); *B32B 2379/08* (2013.01); *B32B 2551/00* (2013.01); *B82Y 20/00* (2013.01)

(58) Field of Classification Search
CPC ............ B32B 37/0008; B32B 2250/00; B32B 2250/03; B32B 2255/00; B32B 2255/10; B32B 2255/205; B32B 2255/26; B32B 2255/28; B32B 2262/00; B32B 2262/10; B32B 2262/106; B32B 2305/00; B32B 2305/22; B32B 2305/28; B32B 2310/00; B32B 2310/08; B32B 2310/0806; B32B 2310/0862; B32B 2310/0868; B32B 2310/14; B32B 2313/00; B32B 2313/04; B32B 2367/00; B32B 2379/00; B32B 2379/08; B32B 2551/00; G02B 5/003; B82Y 20/00; C01B 32/15; D01F 9/00; D02G 3/00; H01L 51/0048
USPC .................................................. 359/601, 612
See application file for complete search history.

(56) References Cited

U.S. PATENT DOCUMENTS

| | | | |
|---|---|---|---|
| 2015/0109799 A1* | 4/2015 | Wu | F21V 1/146 362/352 |
| 2015/0133593 A1* | 5/2015 | kissell | F41H 5/0478 524/496 |
| 2017/0108462 A1* | 4/2017 | Chen | B81C 99/0085 |
| 2018/0043659 A1* | 2/2018 | Ovalle | B32B 27/12 |

OTHER PUBLICATIONS

International Search Report and Written Opinion of the International Searching Authority in related Application Serial No. PCT/US2020/043462, dated Sep. 18, 2020, 11 pages.

* cited by examiner

FIG. 5

510 — A POLYMER FILM IS BONDED TO A NON-WOVEN CNT SHEET.

515 — AN ELASTOMER FILM IS BONDED TO THE POLYMER FILM, CREATING A LAMINATE.

520 — THE LAMINATE IS SCORED.

530 — THE LAMINATE IS FOLDED SO THAT THE CNT SHEET BENDS EASILY ALONG THE SCORES.

540 — THE LAMINATE IS ROLLED TO FORM A CYLINDER BY APPLYING AN ADHESIVE ALONG A BONDING EDGE OF THE LAMINATE TO ADHERE THE BONDING EDGE TO AN OPPOSITE EDGE OF THE LAMINATE, AN OUTER SIDE OF THE LAMINATE COMPRISING DIAMOND-SHAPED ELEMENTS.

550 — ONE OR MORE OF PINCHING, PRESSING, FOLDING AND COLLAPSING IS DONE OF THE DIAMOND-SHAPED ELEMENTS IN A ROTATING MANNER AROUND A CIRCUMFERENCE OF THE CYLINDER, CREATING THE POLYGONALLY SHAPED CNT SHEET OPTICAL BELLOWS.

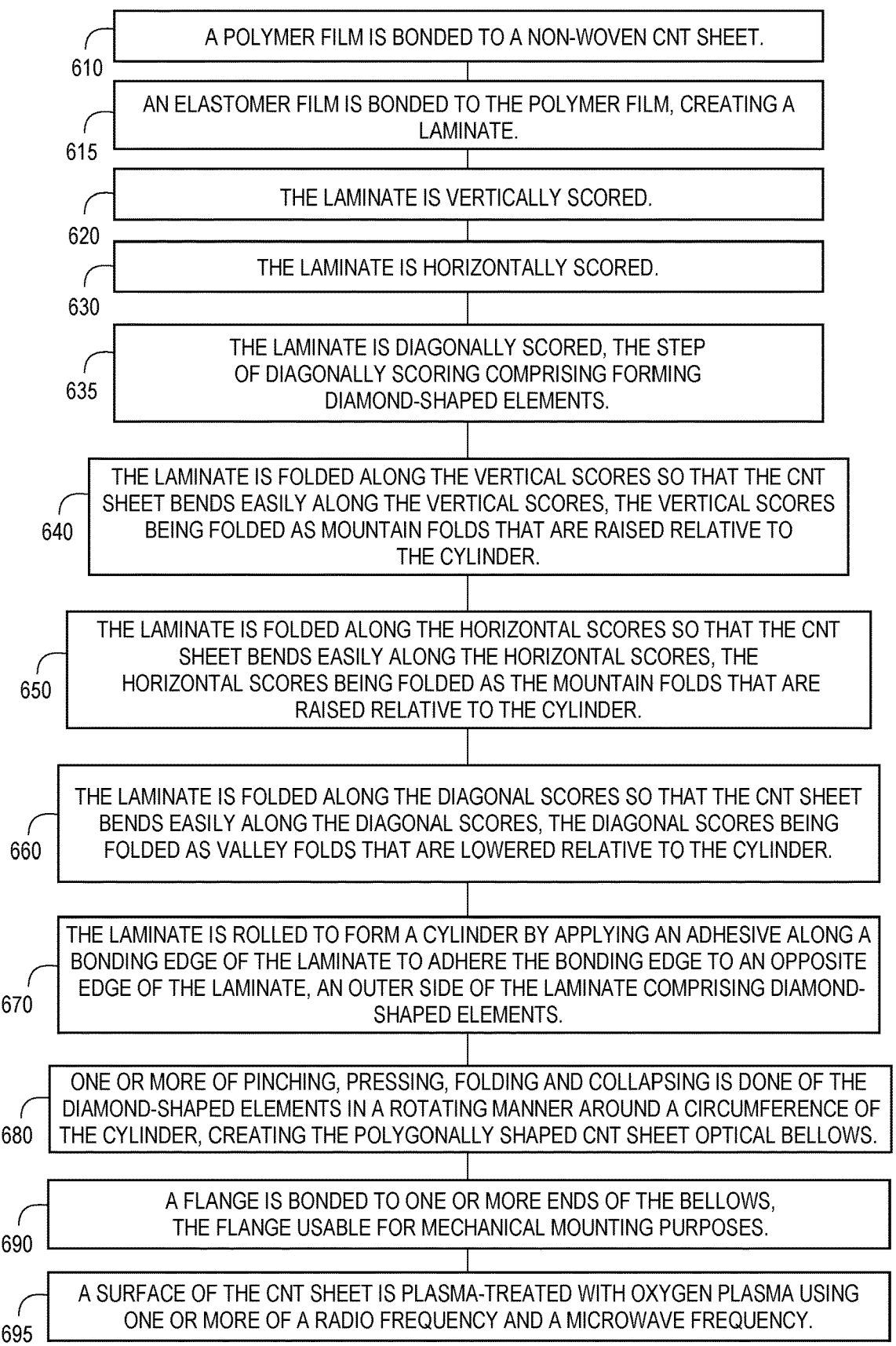

ately 100 MPa and a coefficient of thermal expansion
CARBON NANOTUBE SHEET OPTICAL BELLOWS WITH ENHANCED STRAY LIGHT SUPPRESSION AND METHOD OF MANUFACTURE

STATEMENT OF GOVERNMENT RIGHTS

The Government of the United States of America has rights in this invention pursuant to Government Contract No. 11-C-0042.

SUMMARY

A polygonally shaped carbon nanotube (CNT) sheet optical bellows providing enhanced stray light suppression, the polygonally shaped CNT sheet optical bellows includes: a free-standing non-woven CNT sheet; a polymer film bonded to the non-woven CNT sheet; and an elastomer film bonded to the polymer film, creating a laminate film, the laminate film being rolled to form a cylinder by applying an adhesive along a bonding edge of the laminate film to adhere the bonding edge to an opposite edge of the laminate film, an outer side of the laminate film comprising diamond-shaped elements, the diamond-shaped elements being pinched, pressed, folded and collapsed in a rotating manner around a circumference of the cylinder, creating the polygonally shaped CNT sheet optical bellows.

A method for manufacturing a polygonally shaped carbon nanotube (CNT) sheet optical bellows providing enhanced stray light suppression, includes: bonding a polymer film to a non-woven CNT sheet; bonding an elastomer film to the polymer film, creating a laminate film; scoring the laminate film; folding the laminate film so that the CNT sheet bends easily along the scores; rolling the laminate film to form a cylinder by applying an adhesive along a bonding edge of the laminate film to adhere the bonding edge to an opposite edge of the laminate film, an outer side of the laminate film comprising diamond-shaped elements; and doing one or more of pinching, pressing, folding and collapsing the diamond-shaped elements in a rotating manner around a circumference of the cylinder, creating the polygonally shaped CNT sheet optical bellows.

A method for manufacturing a polygonally shaped carbon nanotube (CNT) sheet optical bellows providing enhanced stray light suppression includes: bonding a polymer film to a non-woven CNT sheet; bonding an elastomer film to the polymer film, creating a laminate film; vertically scoring the laminate film; horizontally scoring the laminate film; diagonally scoring the laminate film, the steps of vertically scoring, horizontally scoring, and diagonally scoring forming diamond-shaped elements; folding the laminate film along the vertical scores so that the CNT sheet bends easily along the vertical scores, the vertical scores being folded as mountain folds that are raised relative to the cylinder; folding the laminate film along the horizontal scores so that the CNT sheet bends easily along the horizontal scores, the horizontal scores being folded as the mountain folds that are raised relative to the cylinder; folding the laminate film along the diagonal scores so that the CNT sheet bends easily along the diagonal scores, the diagonal scores being folded as valley folds that are lowered relative to the cylinder; rolling the laminate film to form a cylinder by applying an adhesive along a bonding edge of the laminate film to adhere the bonding edge to an opposite edge of the laminate film, an outer side of the laminate film comprising diamond-shaped elements; doing one or more of pinching, pressing, folding and collapsing the diamond-shaped elements in a rotating manner around a circumference of the cylinder, creating the polygonally shaped CNT sheet optical bellows; bonding a flange to one or more ends of the bellows, the flange usable for mechanical mounting purposes; and plasma-treating a surface of the CNT sheet with oxygen plasma using one or more of a radio frequency and a microwave frequency.

DESCRIPTION OF THE DRAWINGS

The accompanying drawings provide visual representations which will be used to more fully describe various representative embodiments and can be used by those skilled in the art to better understand the representative embodiments disclosed herein and their inherent advantages. In these drawings, like reference numerals identify corresponding elements.

FIG. 5 is a flow chart of a method for manufacturing a CNT sheet optical bellows with enhanced stray light suppression.

FIG. 6 is a flow chart of a method for manufacturing a CNT sheet optical bellows with enhanced stray light suppression.

DETAILED DESCRIPTION

Figure 1A:
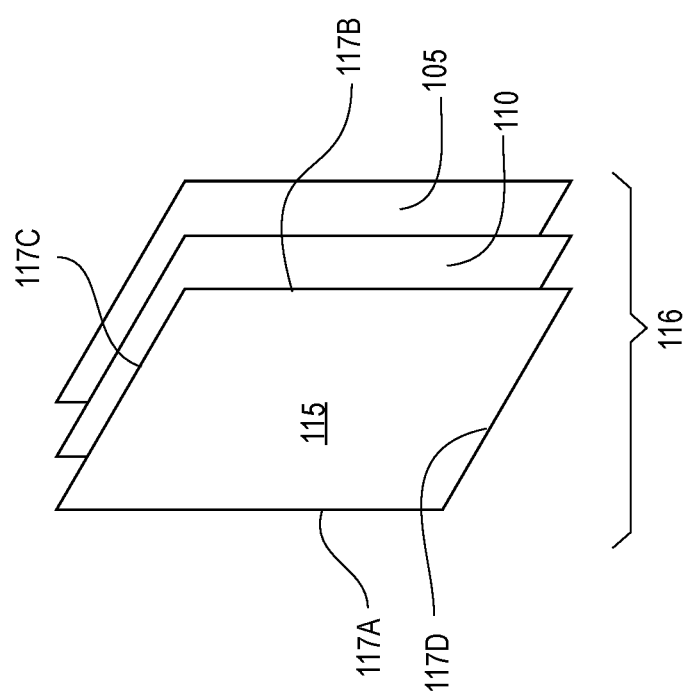
FIGS. 1A-1I is a set of nine drawings showing nine steps in manufacturing a CNT sheet optical bellows.

A carbon nanotube sheet (CNT) sheet optical bellows with enhanced stray light suppression provides low reflectance properties suitable for use in optical instruments. For example, the CNT sheet optical bellows comprises one or more of a free-standing non-woven CNT sheet, a CNT film, and a CNT paper-like material. For example, the CNT sheet comprises carbon nanotubes having a high aspect ratio of between approximately 50 and approximately 10,000. For example, the CNT sheet comprises one or more of single-wall CNT and multi-wall CNT. The CNT's are generally randomly oriented in a plane of the sheet. The CNT sheet is a free-standing mat-like material comprising one or more of single and multi-walled carbon nanotubes with a diameter of approximately 5 to approximately 100 nanometers (nm), having a thickness ranging from approximately 12 microns (μm) to 200 μm, a porosity from approximately 50% to approximately 85% and an area density of approximately 10 grams per square meter to approximately 50 grams per square meter. The CNT sheet material has an ultimate tensile strength of approximately 30 megapascals (MPa) to approximately 100 MPa and a coefficient of thermal expansion generally between −3 parts per million per Kelvin (ppm/K) and approximately +1 ppm/K. An example of a commercially produced CNT sheet material with these physical and mechanical properties is Miralon®, a product manufactured by Nanocomp Technologies, Inc. (www.miralon.com) of Merrimack, N.H.

According to further embodiments of the invention, as described below, a surface of the CNT sheet is plasma-treated. For example, an exposed surface of the CNT sheet is plasma-treated. For example, the CNT sheet is treated with oxygen plasma. For example, the CNT sheet is treated with plasma using one or more of a radio frequency and a microwave frequency. For example, the plasma treatment enhances light-absorbing performance of embodiments of the invention by doing one or more of functionalizing (partially oxidizing) the CNT and unzipping the CNT of sheet material in a surface region.

A representative instrument of this class and equipment successfully used for the plasma treatment according to embodiments of the invention are the Ion 40 instruments manufactured by the PVA-TePLA America Corporation of Corona, Calif. (www.pvateplaamerica.com). The instruments are capable of oxygen plasma surface treatment at processing pressures ranging from 0.16 to 2.7 mbar (120 to 2,000 mTorr) and at operating power levels up to 800 Watts.

A flexible multi-layer laminate film is created using an adhesive. For example, the adhesive comprises one or more of an acrylic adhesive and another film adhesive. The adhesive is used to first bond the non-woven CNT sheet to polyimide film and subsequently also to bond the film combination to an aluminized elastomer film. For example, the adhesive comprises a pressure-sensitive, double-sided adhesive tape. For example, the adhesive comprises a paste adhesive. The adhesive is configured to withstand plasma processing temperatures up to approximately 120° C. for short periods of a few minutes. For space applications, the adhesive is configured to have low outgassing and to withstand temperature ranges of approximately −40° C. to +80° C. while retaining functionality. The resulting tri-layer CNT laminate is then scored, rolled and folded into a polygonally shaped bellows. For example, the polygonally shaped bellows comprises a hexagonally shaped bellows.

The scored, multi-layer laminate is then smoothly bent or rolled to form a cylinder with an adhesive strip aligned and overlapping an entire length of an opposite edge of the laminate. The cylinder comprises the CNT, which functions as an optical absorber, on an interior surface of the cylinder. The acrylic film adhesive is applied in the adhesive strip at the edge of the laminate, bonding edges of the cylinder to form a free-standing tube. Beginning at a top of the cylinder, scored diamond-shaped elements of the cylinder are pinched, pressed, folded and collapsed in a rotating manner around a circumference of the cylinder forming a collapsible polygonally shaped bellows structure. For example, the polygonally shaped bellows structure comprises a hexagonally shaped bellows structure. A flange can be bonded to one or more ends of the bellows and used for mechanical mounting purposes. For example, the flange comprises one or more of aluminum and carbon fiber composite. For example, hexagonal aluminum flanges can be bonded to one or more ends of the bellows, the flange usable for mechanical mounting purposes.

CNT sheet material and origami folding techniques are used to fabricate an expandable polygonal CNT sheet optical bellow.

Materials used for the construction of the CNT sheet optical bellows have a coefficient of thermal expansion (CTE) ranging from approximately 300 ppm to approximately −3 ppm. Thermal cycling tests done between approximately on the entire range, −40° C. to approximately +80° show that the CNT sheet optical bellows maintains its physical integrity throughout this temperature range. The materials used satisfy Military Standard (Mil. Std.) 1540C requirements for thermal vacuum exposure and cycling for one or more of space applications and terrestrial applications. Preferably, but not necessarily, the optical bellows comprises materials that satisfy requirements for both space applications and terrestrial applications. The materials used for the construction of the CNT optical bellows also pass outgassing tests, satisfying an American Society for Testing and Materials (ASTM) E595 specification.

FIGS. 1A-1I is a set of nine drawings showing nine steps in manufacturing a CNT sheet optical bellows.

In FIG. 1A, non-woven CNT sheet material 105 is bonded to a polyimide film 110 using a suitable adhesive (not shown). Each layer of the CNT sheet material has a thickness of between approximately 20 microns and approximately 200 microns. The CNT sheet material comprises between approximately 1 and approximately 20 layers of CNT sheets. The polyimide film 110 comprises one or more of a thermoset polymer film and a thermoplastic polymer film.

For example, the polyimide film 110 comprises Kapton polyimide film, manufactured by Dow Chemical of Midland, Mich. (www.dow.com). The polyimide film 110 is then bonded using the suitable adhesive (not shown) to an elastomer film 115, thereby forming a tri-layer CNT laminate 116. For example, the elastomer film 115 comprises aluminized Chlorosulfonated Polyethylene (CSM) Coated Polyester, which is sold as Hypalon elastomer film, manufactured by Dow Chemical of Midland, Mich. (www.dow.com). The laminate 116 has a laminate left side 117A along a left side of the laminate 116, a laminate right side 117B along a right side of the laminate 116, a laminate top side 117C along a top side of the laminate 116, and a laminate bottom side 117D along a bottom side of the laminate 116.

Figure 1D:
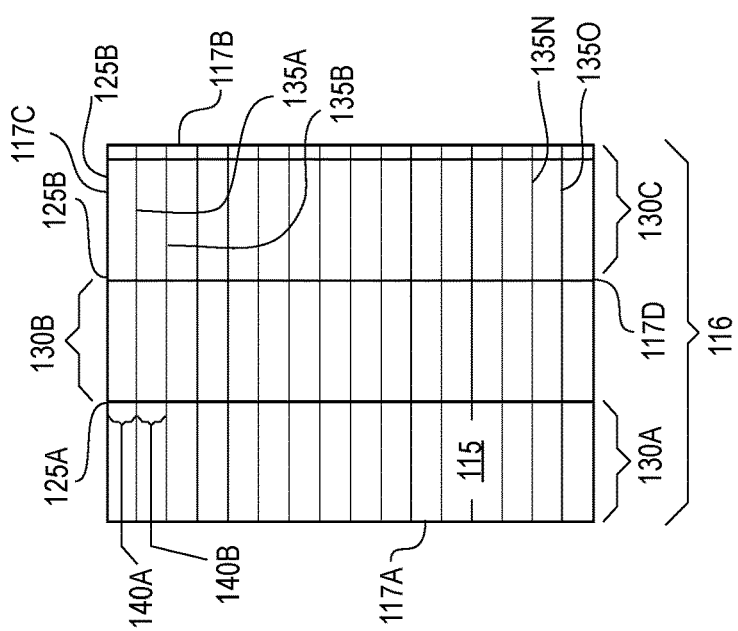
Figure 1C:
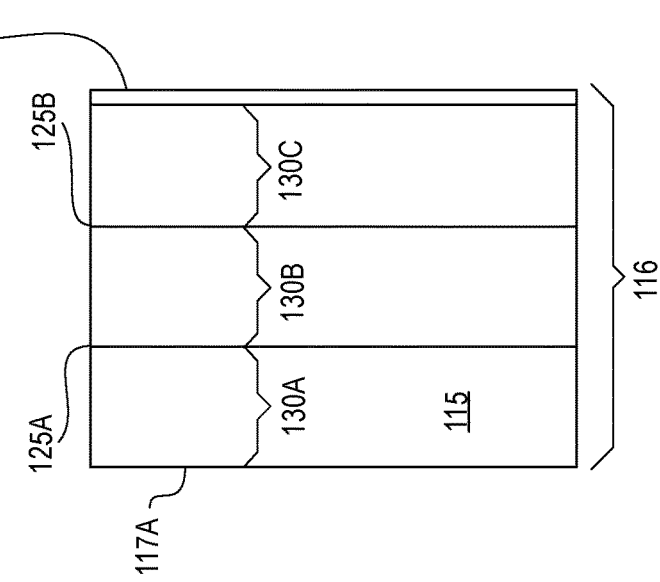
Figure 1B:
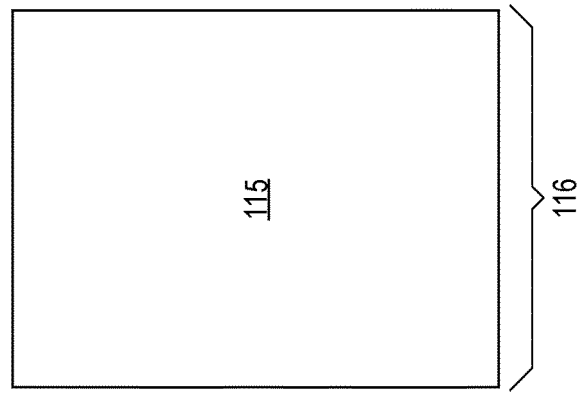

In FIG. 1B, the tri-layer CNT laminate 116 is placed with the elastomer film 115 facing up on a work surface (not shown). For example, the work surface is one or more of clean, dry, and hard. Preferably, but not necessarily, the work surface is clean, dry, and hard. For example, the work surface comprises a scoring board.

In FIG. 1C, the elastomer film 115 is vertically scored, generating a first vertical score 125A. For example, the elastomer film 115 is further vertically scored, creating a second vertical score 125B. For example, the elastomer film 115 is vertically scored using a pointed tool. Preferably, but not necessarily, the first vertical score 125A and the second vertical score 125B and other vertical scores are spaced at a fixed interval. The laminate 116 can be horizontally scored at regular intervals depending on a size of the bellows to be fabricated. As depicted, according to a preferable but not necessary embodiment, a first horizontal distance 130A separates the laminate left side 117A and the first vertical score 125A. As depicted, a second horizontal distance 130B separates the first vertical score 125A from the second vertical score 125B. As depicted, a third horizontal distance 130C separates the second vertical score 125B and the elastomer film right side 117B. As depicted, and preferably, but not necessarily, the first horizontal distance 130A, the second horizontal distance 130B, and the third horizontal distance 130C are all approximately equal.

In FIG. 1D, the elastomer film side 115 is horizontally scored, generating horizontal scores 135A-135O. For example, the elastomer film side 115 is horizontally scored using a pointed tool. Preferably, but not necessarily, the horizontal scores 135A-135O are spaced at a fixed interval. As depicted, according to a preferable but not necessary embodiment, a first vertical distance 140A separates the elastomer film top side 117C and the first horizontal score 135A. As depicted, a second vertical distance 140B separates the first horizontal score 135A from the second horizontal score 135B. As depicted, and preferably, but not necessarily, the first vertical distance 140A, the second vertical distance 140B, and the third and later vertical distances 140C, 140D, and so on are all approximately equal.

The CNT laminate 116 is then folded and creased along the vertical scores 125A and 125B so that the CNT laminate 116 bends easily along the vertical scores 125A and 125B. Similarly, the CNT laminate 116 is then folded and creased along the horizontal scores 135A-135O so that the CNT laminate 116 bends easily along the horizontal scores 135A-135O.

Figure 1F:
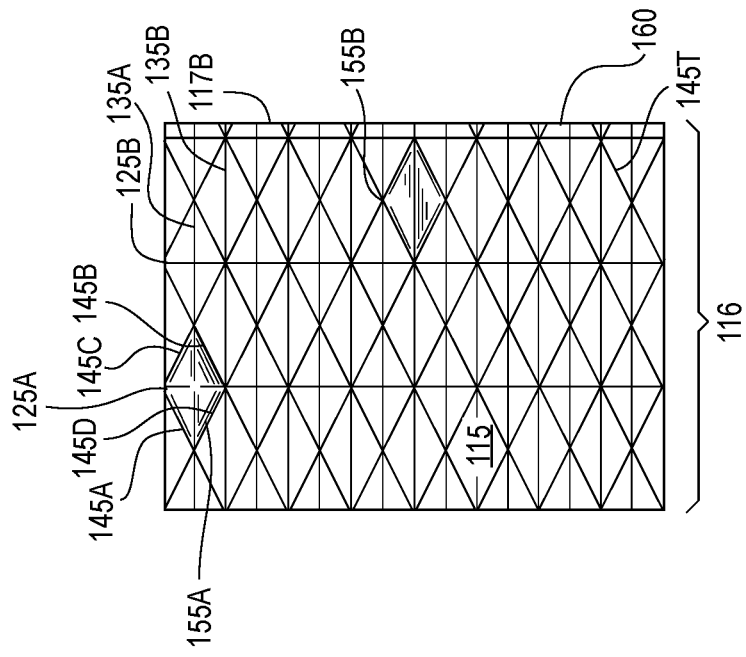
Figure 1E:
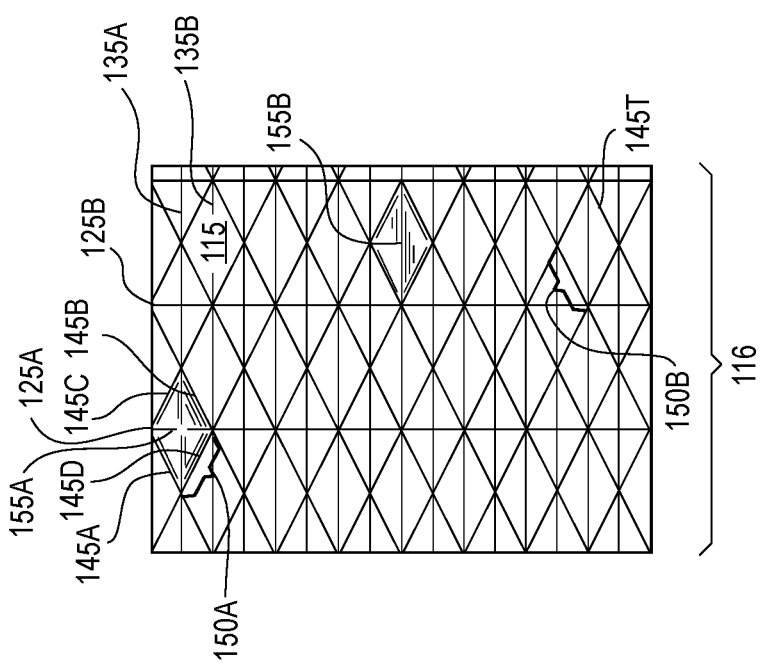

In the next step, as shown in FIG. 1E, a similar process to that performed in FIG. 1D is performed but now diagonal scores 145A-145T are created and then the CNT laminate 116 is folded and creased along the diagonal scores 145A-145T.

More specifically, the elastomer film side 115 is diagonally scored, generating diagonal scores 145A-145T. For example, the elastomer film side 115 is diagonally scored using a pointed tool. Preferably, but not necessarily, the diagonal scores 145A-145T are spaced at a fixed interval. As depicted, according to a preferable but not necessary embodiment, a first diagonal distance 150A separates the first diagonal score 145A and the second diagonal score 145B. As depicted, a second vertical distance 150B separates the third diagonal score 145C from the fourth diagonal score 145D. As depicted, and preferably, but not necessarily, the first diagonal distance 150A, the second diagonal distance 150B, and the third and later diagonal distances 150C, 150D, and so on are all approximately equal. The first through fourth diagonal scores 145A-145D form a scored diamond-shaped element 155A. The diagonal scores 145A-145T form many scored diamond-shaped elements 155A-155T.

The CNT laminate 116 is then folded and creased along the diagonal scores 145A-145T so that the CNT laminate 116 bends easily along the diagonal scores 145A-145T.

In FIG. 1F, an adhesive is applied along a bonding edge 160 of the CNT laminate 116, creating an adhesive strip 160. Preferably, but not necessarily, an acrylic film adhesive is applied. For example, and as depicted, the elastomer film right side 117B comprises the bonding edge 160. This bonding edge 160 enables the subsequent formation of the CNT laminate 116 into a tube or cylinder as described below and as shown below in FIG. 1H. Shown again are the vertical scores 125A-125B, the horizontal scores 135A-135O, and the diagonal scores 145A-145T.

Beginning at a top of the cylinder, scored diamond-shaped elements of the cylinder are carefully pinched, pressed, folded, and collapsed in a rotating manner around a circumference of the cylinder, forming a collapsible hexagonal bellows.

Figure 1I:
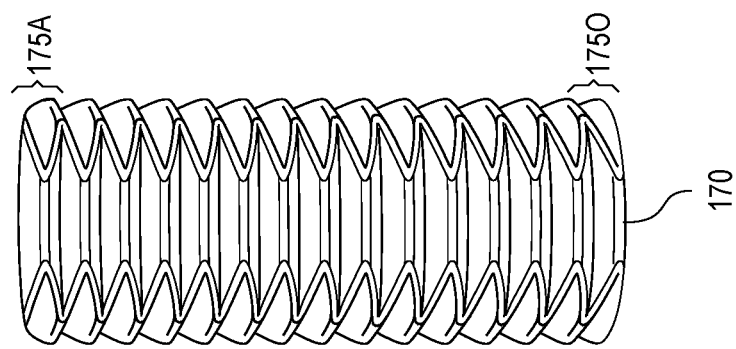
Figure 1H:
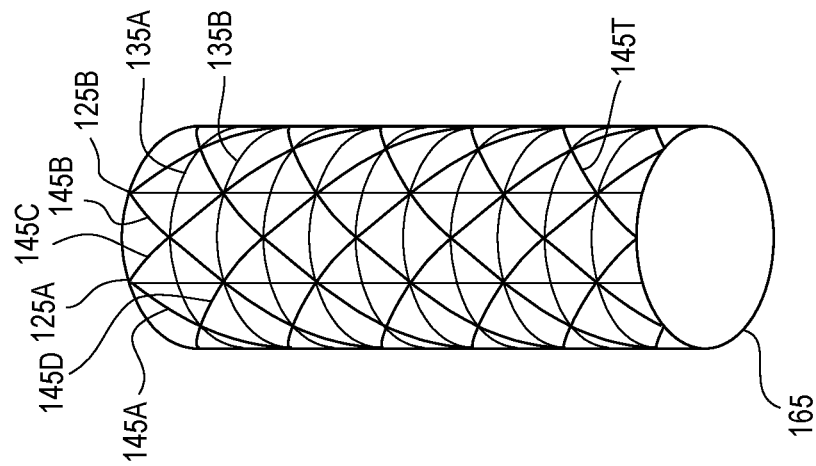
Figure 1G:
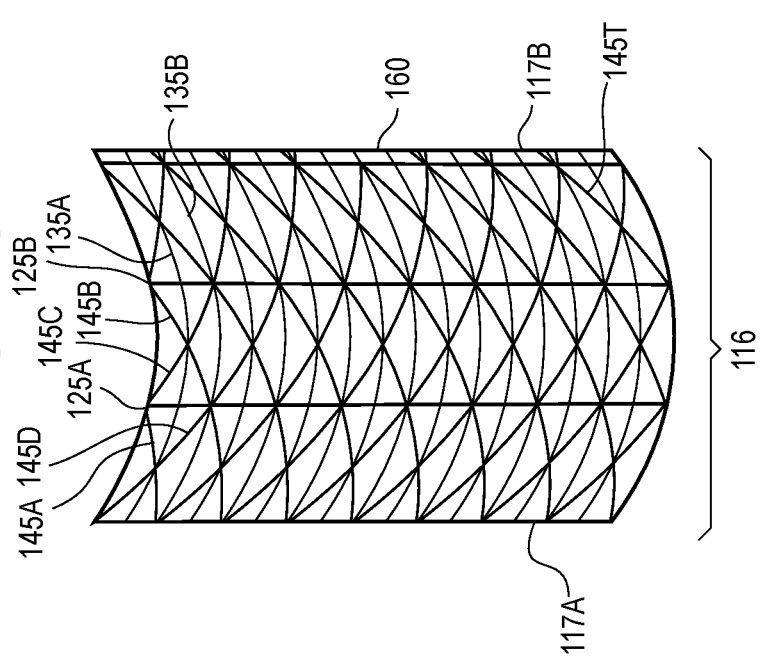

In FIG. 1G, the scored, multi-layer laminate 116 is then smoothly bent or rolled to form a cylinder (not shown in this figure but the CNT laminate cylinder 165 in FIG. 1H) by attaching the adhesive strip 160 to the elastomer film left edge 117A, bonding the adhesive strip 160 (which as mentioned above comprises the elastomer film right edge 117B) to the elastomer film left edge 117A. Shown again are the vertical scores 125A-125B, the horizontal scores 135A-135O, and the diagonal scores 145A-145T.

In FIG. 1H, the free-standing CNT laminate cylinder 165 is formed. Shown again are the vertical scores 125A-125B, the horizontal scores 135A-135O, and the diagonal scores 145A-145T. The diagonal scores 145A-145T are folded as valley folds that are lowered relative to the CNT laminate cylinder 165. The vertical scores 125A-125B are folded as mountain folds that are raised relative to the CNT laminate cylinder 165. Similarly, the horizontal scores 135A-135O are folded as mountain folds that are raised relative to the CNT laminate cylinder 165. The scored diamond-shaped elements 155A-155T are then carefully pinched, folded, and collapsed in a rotating manner around a circumference of the CNT laminate cylinder 165.

In FIG. 1I, this process results in a partially extended CNT sheet optical bellows 170, which is ready for one or more of attachment of a mechanical end mounting flange (not shown) and integration of the CNT sheet optical bellows with a deployment mechanism (not shown). For example, the flange is mounted to the bellows end and used for mechanical mounting purposes.

Figure 2:
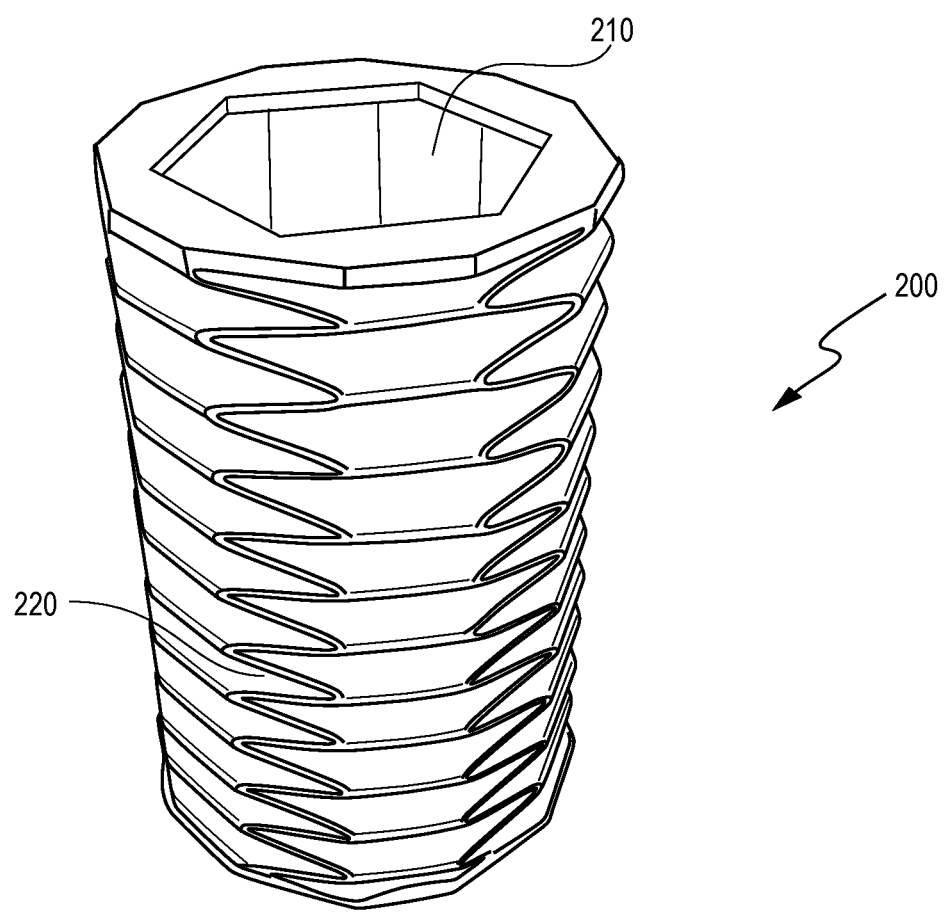
FIG. 2 depicts a fabricated polygonally shaped bellows.

FIG. 2 depicts a fabricated hexagonal bellows 200. The bellows 200 comprises origami-folded laminate comprising a non-woven CNT sheet interior 210 bonded to an aluminized polymer film 220. For example, the CNT sheet interior 210 comprises multiwalled CNT (MWCNT). The bellows design is scalable and is made of all space-qualifiable materials. For example, the bellows 200 has a diameter 230 measured of between approximately 2.5 inches and approximately two feet. For example, the bellows 200 has an expansion ratio, defined as a ratio of an expanded length to a length of the bellows 200 in a compressed state, between approximately 2 and approximately 50.

Figure 3:
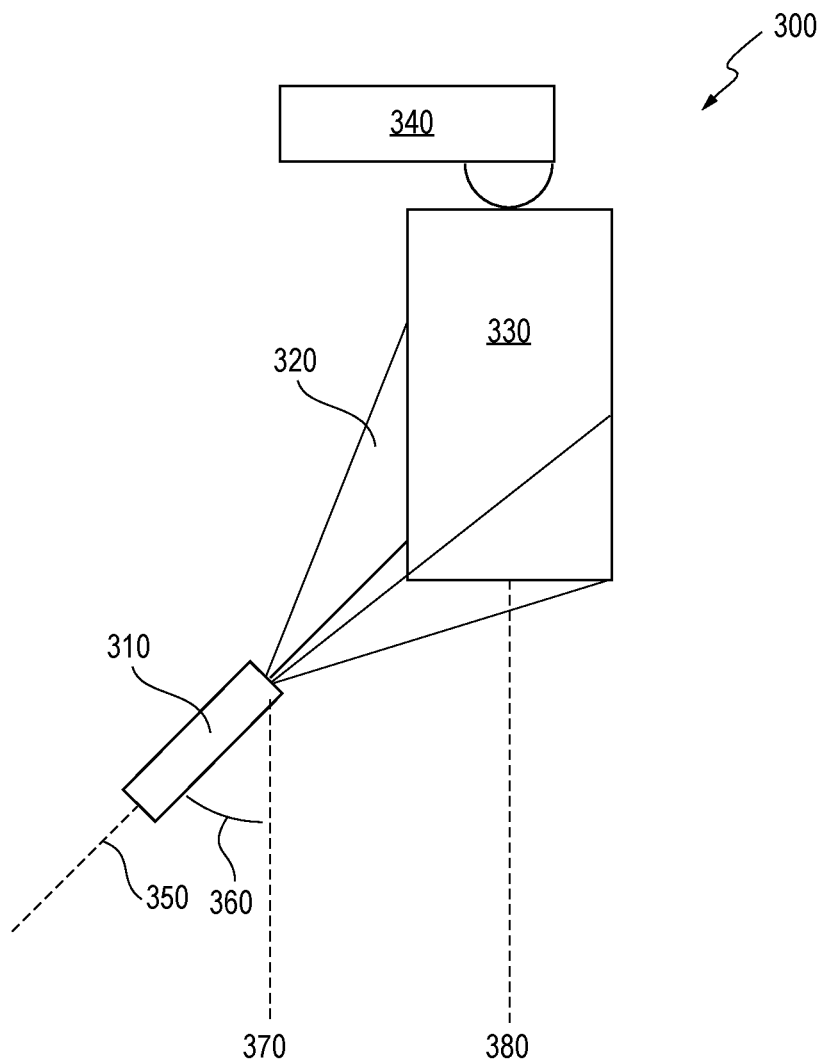
FIG. 3 is a drawing of a setup used to gather illuminance data, including a light source, an optical rail, a CNT sheet optical bellows, and a light meter that is used to measure illuminance.

FIG. 3 is a drawing 300 of a setup used to gather illuminance data depicted below in FIG. 4, including a pivoting light source 310, an optical rail 320, a CNT sheet optical bellows 330, and a light meter 340 that is used to measure illuminance. Preferably, but not necessarily, the light source 310 comprises a light-emitting diode (LED) light source 310. The optical rail 320 holds one or more of the light source 310, the CNT sheet optical bellows 330, and the light meter 340. Preferably, but not necessarily, the optical rail 320 holds the light source 310, the CNT sheet optical bellows 330, and the light meter 340. Preferably, but not necessarily, the optical rail 320 holds the light source 310, the CNT sheet optical bellows 330, and the light meter 340 on a common axis 350. The common axis 350 forms an angle 360 with a vertical line 370 that is parallel to a bellows axis 380 of the optical bellows 330. The angle 360 is the angle 420 that is plotted along an x axis in FIG. 4. A six-fold reduction in illuminance according to embodiments of the invention is evident in FIG. 4 below.

Figure 4:
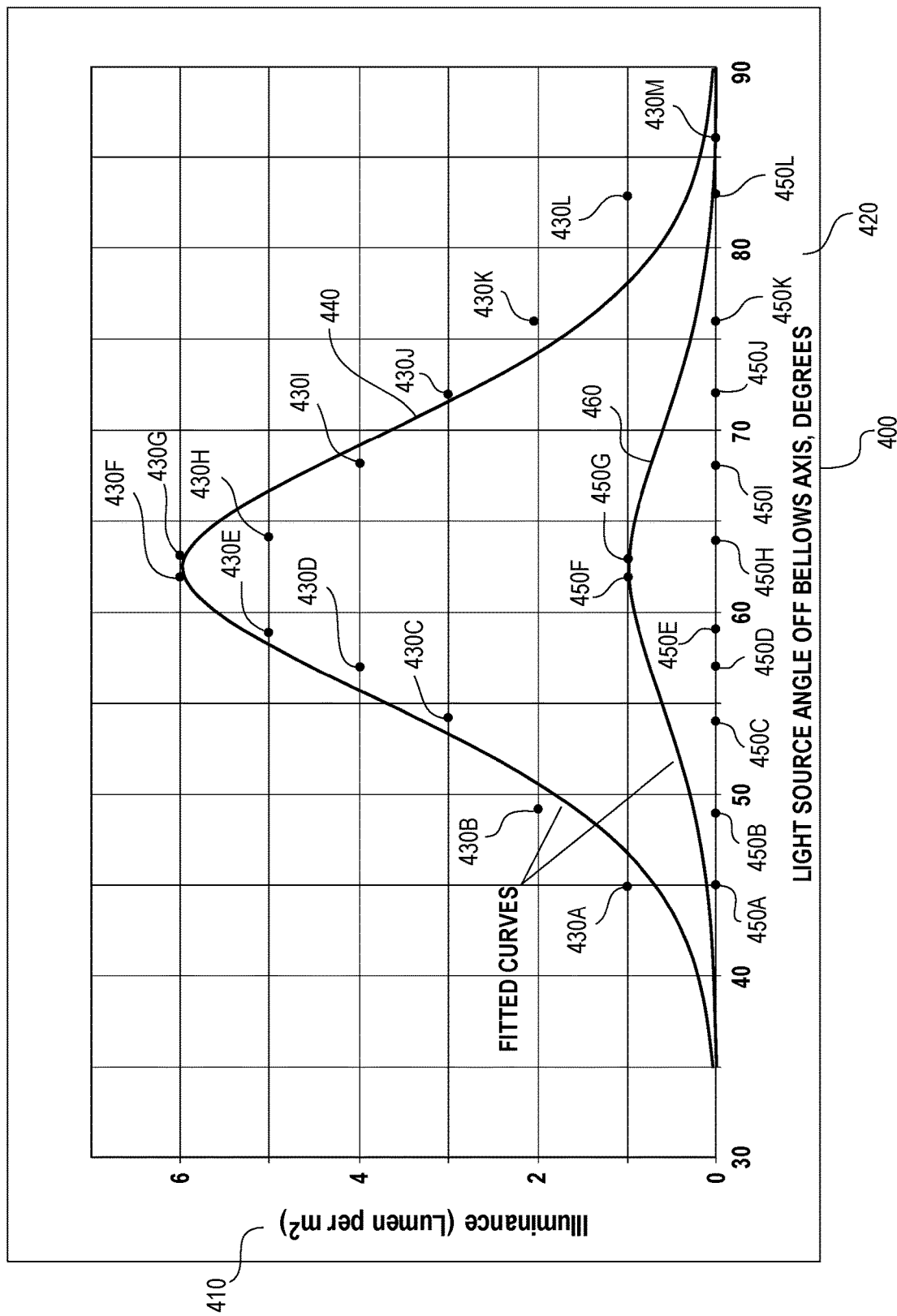
FIG. 4 is a graph showing a plot of illuminance of the CNT sheet optical bellows vs. an angle by which the light source is off the axis of the CNT sheet optical bellows.

FIG. 4 is a graph 400 showing a plot of illuminance (lumens per square meter [$m^2$], also known as lux) 410 of the CNT sheet optical bellows vs. an angle 420 (degrees) by which the light source is off the axis of the CNT sheet optical bellows. Pre-plasma treatment data points 430 and a pre-plasma fitted curve 440 are depicted, showing an illuminance peaking at approximately 6 lumens per square meter. Post-plasma treatment data points 450 and a post-plasma fitted curve 460 are depicted, peaking at approximately 1 lumen per square meter, showing an approximate six-fold reduction in illuminance.

FIG. 5 is a flow chart of a method 500 for manufacturing a carbon nanotube (CNT) sheet optical bellows with enhanced stray light suppression.

The order of the steps in the method 500 is not constrained to that shown in FIG. 5 or described in the following discussion. Several of the steps could occur in a different order without affecting the final result.

In step 510, a polymer film is bonded to a non-woven CNT sheet. Block 510 then transfers control to block 515.

In step 515, an elastomer film is bonded to the polymer film, creating a laminate film. Block 515 then transfers control to block 520.

In step 520, the laminate film is scored. Block 520 then transfers control to block 530.

In step 530, the laminate film is folded so that the CNT sheet bends easily along the scores. Block 530 then transfers control to block 540.

In step 540, the laminate film is rolled to form a cylinder by applying an adhesive along a bonding edge of the laminate film to adhere the bonding edge to an opposite edge of the laminate film, an outer side of the laminate film comprising diamond-shaped elements. Block 540 then transfers control to block 550.

In step 550, one or more of pinching, pressing, folding and collapsing is done of the diamond-shaped elements in a rotating manner around a circumference of the cylinder, creating the polygonally shaped CNT sheet optical bellows. This step optionally comprises a sub-step of bonding a flange to one or more ends of the bellows, the flange usable for mechanical mounting purposes. Block 550 then terminates the process.

FIG. 6 is a flow chart of a method 600 for manufacturing a carbon nanotube (CNT) sheet optical bellows with enhanced stray light suppression.

The order of the steps in the method 600 is not constrained to that shown in FIG. 6 or described in the following discussion. Several of the steps could occur in a different order without affecting the final result.

In step 610, a polymer film is bonded to a non-woven CNT sheet. Block 610 then transfers control to block 620.

In step 615, an elastomer film is bonded to the polymer film, creating a laminate film. Block 615 then transfers control to block 620.

In step 620, the laminate film is vertically scored. Block 620 then transfers control to block 630.

In step 630, the laminate film is horizontally scored. Block 630 then transfers control to block 635.

In step 635, the laminate film is diagonally scored, the steps of vertically scoring, horizontally scoring, and diagonally scoring forming diamond-shaped elements. Block 635 then transfers control to block 640.

In step 640, the laminate film is folded along the vertical scores so that the CNT sheet bends easily along the vertical scores, the vertical scores being folded as mountain folds that are raised relative to the cylinder. Block 640 then transfers control to block 650.

In step 650, the laminate film is folded along the horizontal scores so that the CNT sheet bends easily along the horizontal scores, the horizontal scores being folded as the mountain folds that are raised relative to the cylinder. Block 650 then transfers control to block 660.

In step 660, the laminate film is folded along the diagonal scores so that the CNT sheet bends easily along the diagonal scores, the diagonal scores being folded as valley folds that are lowered relative to the cylinder. Block 660 then transfers control to block 670.

In step 670, the laminate film is rolled to form a cylinder by applying an adhesive along a bonding edge of the laminate film to adhere the bonding edge to an opposite edge of the laminate film, an outer side of the laminate film comprising diamond-shaped elements. Block 670 then transfers control to block 680.

In step 680, one or more of pinching, pressing, folding and collapsing is done of the diamond-shaped elements in a rotating manner around a circumference of the cylinder, creating the polygonally shaped CNT sheet optical bellows. Block 680 then transfers control to block 690.

In step 690, a flange is bonded to one or more ends of the bellows, the flange usable for mechanical mounting purposes Block 690 then transfers control to block 685.

In step 695, a surface of the CNT sheet is plasma-treated with oxygen plasma using one or more of a radio frequency and a microwave frequency. For example, an exposed surface of the CNT sheet is plasma-treated with the oxygen plasma using the one or more of a radio frequency and a microwave frequency. Block 695 terminates the process.

A further advantage of embodiments of the invention is that they overcome several limitations of current stray light suppression systems in telescopes and other instruments employing a series of black coated mechanical stops and thin edge vanes: (i) limited absorbance properties (95-97% visible wavelength) (ii) and are not broad band (UV to near IR) absorbers, (iii) do not bond well and stay adhered during thermal cycling when applied to sharp, small radius (0.1 mm) vane edges, (iv) even the sharpest coated vane edges are not "zero thickness" and represent a stray light reflective source within the instrument.

A still additional advantage of embodiments of the invention is that the embodiments of the invention have one or more of internal high absorbing fold walls, low light scattering fold edges, and effective edge radii in the micrometer range.

A yet additional advantage of embodiments of the invention is that the vacuum plasma treatment avoids difficulties associated with prior art methods of treatment of complex shaped objects such as optical bellows interior surfaces to enhance their light absorbing performance, including difficulties associated with penetration of cylindrical or linear nozzles into mountain and valley topologies, and the need for such nozzles to be positioned within a few millimeters of the working surface, thereby making it hard to complete the plasma treatment without contact and optical surface damage. An advantage of embodiments of the invention is that the teachings of embodiments of the invention regarding use of plasma vacuum chamber instruments avoids the prior art difficulties of positioning the nozzle near the surface without causing damage.

A yet additional advantage of embodiments of the invention is that for wavelengths between approximately 250 nanometers (nm) to approximately 2,500 nm, embodiments of the invention provide an average material reflectance of approximately 0.80% compared to prior art reflectances of approximately 3.2% or at least 4× improvement. The low reflectance properties are advantageous for space optical instruments such as: visible and infrared wavelength sensor housings, star trackers, deployable bellows, and telescope baffles and barrels. A still further advantage is that embodiments of the invention provide a minimum bend radius of less than approximately 10 microns compared to prior art minimum bend radii of approximately 100 microns.

A further advantage of embodiments of the invention is that they provide enhanced suppression of one or more of stray radiation and light, and as such are suitable for one or more of next generation airborne sensors and space instruments employing one or more of bolometric sensors and image sensors with sensitivities ranging from 1E-22 to 1E-37 Watts per square meter and with operation extending from the X-ray to the far infrared portion of the spectrum.

Another advantage of embodiments of the invention is improving signal-to-noise ratios for these next generation sensors and instruments.

Another advantage of embodiments of the invention is they provide lower one or more of significantly lower visible reflectance and significantly lower near infrared reflectance properties relative to current state-of-the-art black coatings.

Another advantage of embodiments of the invention is that they provide significant stray light performance advantages.

A still additional advantage of embodiments of the invention is that the exceptionally high strain and flexural strength properties of CNT permit sheet materials to be creased and origami-folded into complex structures with small bend radii. They permit a collapsible and deployable optical bellows to be constructed directly out of optical absorber material.

Another advantage of embodiments of the invention is that as discussed above, the CNT wall surfaces are approximately four times less reflective over a large wavelength band relative to traditional Aeroglaze Z307-coated surfaces. A still other advantage of embodiments of the invention is that the CNT sheet can be folded so as to attain edges of the vane having an effectively ten times smaller bend radius than machined metal vane edges. And unlike prior art Z307-coated high curvature vanes, the inventive integral absorber does not flake off during thermal cycle. Combined with the nanoporosity of the inventive CNT sheets, the absorber material offers a reduction of greater than ten times of light scattering off an edge surface.

It will be further understood by those of skill in the art that the number of variations of embodiments of the invention are virtually limitless. For example, while vertical scores, horizontal scores, and diagonal scores are mentioned in the application, any arbitrary pattern of scores can be used, as long as the general outlines of the embodiments of the invention are used. The scores need not be one or more of parallel to each other and orthogonal to each other. Scores can be separated by an arbitrary number of degrees of arc from each other. Embodiments of the invention can also employ scores that do not extend as straight lines throughout the entire bellows but may instead do one or more of bend, curve, double back on themselves, and so on.

While mention is made in this disclosure of a polygonally shaped bellows, with a specific example of a hexagonally shaped bellows, the bellows is created according to embodiments of the invention in an arbitrary shape. For example, the shape of the bellows is polygonal. For example, the shape of the bellows is a regular polygon such as a square, a pentagon, a heptagon, an octagon, and the like. For example, the shape of the bellows is an irregular polygon. For example, the bellows may be tapered, having a larger diameter at one end and a smaller diameter at the other end.

While the above representative embodiments have been described with certain components in exemplary configurations, it will be understood by one of ordinary skill in the art that other representative embodiments can be implemented using different configurations and/or different components. For example, it will be understood by one of ordinary skill in the art that the order of certain steps and certain components can be altered without substantially impairing the functioning of the invention.

The representative embodiments and disclosed subject matter, which have been described in detail herein, have been presented by way of example and illustration and not by way of limitation. It will be understood by those skilled in the art that various changes may be made in the form and details of the described embodiments resulting in equivalent embodiments that remain within the scope of the invention. It is intended, therefore, that the subject matter in the above description shall be interpreted as illustrative and shall not be interpreted in a limiting sense.

What is claimed is:

1. A polygonally shaped carbon nanotube (CNT) sheet optical bellows providing enhanced stray light suppression, the polygonally shaped CNT sheet optical bellows comprising:
    a free-standing non-woven CNT sheet, the CNT's randomly oriented in a plane of the sheet, the CNT's having a high aspect ratio of between approximately 50 and approximately 10,000;
    a polymer film bonded to the non-woven CNT sheet; and
    an elastomer film bonded to the polymer film, creating a laminate film, the laminate film being rolled to form a cylinder by applying an adhesive along a bonding edge of the laminate film to adhere the bonding edge to an opposite edge of the laminate film, an outer side of the laminate film comprising diamond-shaped elements, the diamond-shaped elements being pinched, pressed, folded and collapsed in a rotating manner around a circumference of the cylinder, creating the polygonally-shaped CNT sheet optical bellows.

2. The optical bellows of claim 1, wherein:
    the polymer film comprises one or more of a thermoset polymer film and a thermoplastic polymer film.

3. The optical bellows of claim 2, wherein:
    the polymer film is bonded to the CNT sheet using a pressure-sensitive, double-sided adhesive tape.

4. The optical bellows of claim 1, wherein the CNT sheet comprises one or more of single-wall CNT and multi-wall CNT.

5. The optical bellows of claim 1, wherein a surface of the CNT sheet is plasma-treated.

6. The optical bellows of claim 1, wherein the laminate film comprises vertical scores.

7. The optical bellows of claim 1, wherein the laminate film comprises horizontal scores.

8. The optical bellows of claim 7, wherein the laminate film further comprises diagonal scores, the diagonal scores forming the diamond elements.

9. A method for manufacturing a polygonally shaped carbon nanotube (CNT) sheet optical bellows providing enhanced stray light suppression, comprising:
    bonding a polymer film to a non-woven CNT sheet, the CNT's randomly oriented in a plane of the sheet, the CNT's having a high aspect ratio of between approximately 50 and approximately 10,000;
    bonding an elastomer film to the polymer film, creating a laminate film;
    scoring the laminate film;
    folding the laminate film so that the CNT sheet bends easily along the scores;
    rolling the laminate film to form a cylinder by applying an adhesive along a bonding edge of the laminate film to adhere the bonding edge to an opposite edge of the laminate film, an outer side of the laminate film comprising diamond-shaped elements;
    doing one or more of pinching, pressing, folding and collapsing the diamond-shaped elements in a rotating manner around a circumference of the cylinder, creating the polygonally shaped CNT sheet optical bellows.

10. The method of claim 9, wherein the scoring step comprises one or more sub-steps of: vertically scoring the laminate film, horizontally scoring the laminate film, and diagonally scoring the laminate film.

11. The method of claim 9, wherein the scoring step comprises vertically scoring the laminate film, horizontally scoring the laminate film, and diagonally scoring the laminate film.

12. The method of claim 11, wherein the sub-steps of vertically scoring the laminate film, horizontally scoring the laminate film, and diagonally scoring the laminate film form diamond-shaped elements.

13. The method of claim 9, wherein folding comprises folding the diagonal scores as valley folds that are lowered relative to the cylinder.

14. The method of claim 9, wherein folding comprises folding the vertical scores as mountain folds that are raised relative to the cylinder.

15. The method of claim 9, wherein folding comprises folding the horizontal scores as mountain folds that are raised relative to the cylinder.

16. The method of claim 9, wherein the step of plasma-treating comprises plasma-treating with oxygen plasma.

17. The method of claim 9, wherein the step of plasma-treating comprises using one or more of a radio frequency and a microwave frequency.

18. A method for manufacturing a polygonally shaped carbon nanotube (CNT) sheet optical bellows providing enhanced stray light suppression, comprising:

bonding a polymer film to a non-woven CNT sheet, the CNT's randomly oriented in a plane of the sheet, the CNT's having a high aspect ratio of between approximately 50 and approximately 10,000;

bonding an elastomer film to the polymer film, creating a laminate film;

vertically scoring the laminate film;

horizontally scoring the laminate film;

diagonally scoring the laminate film, the steps of vertically scoring, horizontally scoring, and diagonally scoring forming diamond-shaped elements;

folding the laminate film along the vertical scores so that the CNT sheet bends easily along the vertical scores, the vertical scores being folded as mountain folds that are raised relative to the cylinder;

folding the laminate film along the horizontal scores so that the CNT sheet bends easily along the horizontal scores, the horizontal scores being folded as the mountain folds that are raised relative to the cylinder;

folding the laminate film along the diagonal scores so that the CNT sheet bends easily along the diagonal scores, the diagonal scores being folded as valley folds that are lowered relative to the cylinder;

rolling the laminate film to form a cylinder by applying an adhesive along a bonding edge of the laminate film to adhere the bonding edge to an opposite edge of the laminate film, an outer side of the laminate film comprising diamond-shaped elements;

doing one or more of pinching, pressing, folding and collapsing the diamond-shaped elements in a rotating manner around a circumference of the cylinder, creating the polygonally shaped CNT sheet optical bellows;

bonding a flange to one or more ends of the bellows, the flange usable for mechanical mounting purposes; and plasma-treating a surface of the CNT sheet with oxygen plasma using one or more of a radio frequency and a microwave frequency.

* * * * *